March 28, 1967 R. E. ANDERSON 3,310,866

MOUNTINGS FOR POWER TRANSISTORS

Filed Aug. 28, 1964

Robert E. Anderson
INVENTOR.
BY John E. Vandigriff 3,310,866
Patented Mar. 28, 1967

3,310,866

MOUNTINGS FOR POWER TRANSISTORS

Robert E. Anderson, Kingsville, Tex., assignor to Texas Instruments Incorporated, Dallas, Tex., a corporation of Delaware Filed Aug. 28, 1964, Ser. No. 392,888
2 Claims. (Cl. 29—155.5)

This invention relates to semiconductor devices and more particularly to an improved construction for junction type transistors for use in power applications.

A typical P-N junction type transistor, by way of example, comprises a body of semiconductor material of one conductivity type having one or more P-N junctions formed therein. The P-N junctions consist of zones of N-type and P-type conductivity materials separated by rectifying barriers which have high resistance to current flow in one direction and low resistance to such flow in the reverse direction. One method of preparing such a transistor is known as the alloying method, wherein two pellets of the same impurity material are positioned on opposite surfaces of a semiconductor wafer to produce regions of conductivity type opposite to that of the wafer. This assembly is heated to cause both materials to melt and dissolve in the semiconductor wafer. After a predetermined heating period the assembly is allowed to cool, and upon cooling the molten material regrows, or recrystallizes, to form a P-N rectifying junction beneath each surface of the wafer. Adjacent to each P-N junction and protruding above each surface of the wafer, the recrystallized material is an alloy of the impurity material and the semiconductor material.

In such transistors, one of the two outer regions of the same conductivity type is operated as the emitter while the other region (on the opposite surface) is operated as the collector. An ohmic non-rectifying contact is bonded to the third or middle region (the semiconductor wafer itself) and constitutes the base of the device.

In the operation of such a transistor under the control of an input signal applied either to the emitter or the base, the emitter injects minority charge carriers into the base region. These carriers are then collected in the collector region, the electrode of which is the output of the device to which a suitable output circuit may be connected.

As in conventional circuits, the flow of current through a semiconductor device heats the device. The problem of heat dissipation is particularly important in the operation of a transistor which is required to handle considerable quantities of power, since the transistor may be destroyed by excessive heating.

Another type of transistor using a diffusion process may be made. Diffusion is the interpenetration of the semiconductor material with some element to change the conductivity characteristics of the diffused region. In this process there are two diffusions into a semiconductor wafer. These diffusions constitute regions within the wafer, the first region being the base region and the second being the emitter region. The remaining undiffused region constitutes the collector region. These two diffusions are generally made into the same surface of the wafer. Such devices may be either planar or of mesa-planar construction. As with the alloy devices, heat dissipation is a problem, and it is important in mounting these devices so that the heat may be readily dissipated therefrom.

One solution heretofore has been to immerse the semiconductor device in a metallic container filled with an oil or some other liquid. However, the conventional oils generally utilized for such a purpose have been unsatisfactory because they do not provide adequate heat dissipation and because they often impair the device itself by adversely affecting the surface of the semiconductor wafer.

In the case of an alloy transistor another solution has been to bond heat radiators to the wafer and to one or both of the alloyed regions adjacent to the P-N junction in the wafer. The use of heat radiators does not, however, always produce the degree of heat dissipation required in power transistors.

In the case of planar or diffused type transistors, it is common to mount the semiconductor wafer directly onto the header so that the heat may be dissipated through the collector region into the mass of a header material. This method is not always satisfactory since the collector contact material may not be a good heat dissipator or, because of the thickness of the contact structure, sufficient heat cannot be dissipated.

It is, then, an object of the invention to provide a method of mounting a semiconductor device, a transistor or the like, upon a heat radiator to secure an improved capacity for heat radiation.

A further object is to extend, in semiconductor devices, the range of useful power consumption relative to the quantity of power dissipated in heat.

A further object is to provide an improvement in making electrical connection between the transistor and a metal heat radiator.

Other objects and features will be more readily understood from the following description when read in conjunction with the appended claims and attached drawing in which:

Figure 1:
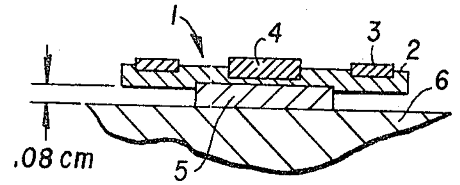
FIGURE 1 is a cross-sectional elevation of an alloy type transistor of conventional design.
Figure 2:
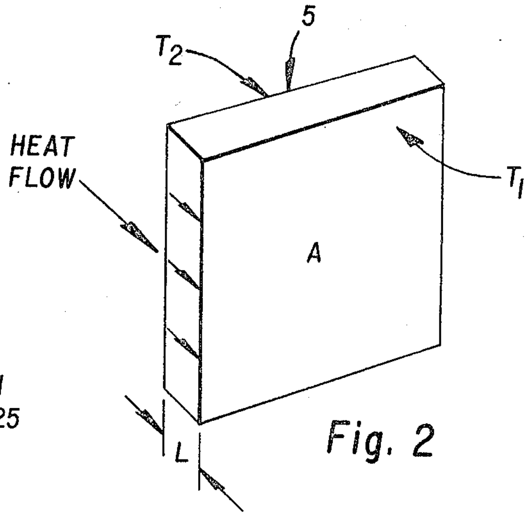
FIGURE 2 is a drawing illustrating the heat flow in dimensions of a semiconductor contact.

Referring now to FIGURES 1 and 2, an example of the heat dissipation of an alloy type transistor is shown. In FIGURE 1 there is shown a transistor 1 having a semiconductor wafer 2. Alloyed into one side is an emitter contact and junction 4 and in the opposite face is alloyed the collector contact and junction 5. The base contact is shown at 3. The collector contact 5 is mounted upon a flat header surface 6. For this particular device it is assumed that the distance from the lower face of the semiconductor wafer 2 is about 0.08 centimeter from the mounting surface 6. If the collector region is of a configuration shown in FIGURE 2 having a thickness L and a cross-section area A, the thermal factor involved is as follows: Consider a transistor whose recommended power dissipation is 25 watts. If the collector area is about 0.375 centimeter square and the collector contact is a slab of indium of about 0.30 centimeter square and a thickness of 0.08 centimeter, the heat flow from such a slab is $$\frac{dQ}{dt}=\frac{AK(T_2-T_1)}{L} \qquad (1)$$

where:

$dQ/dt$=the number of calories/sec.;
$K$=the thermal conductivity of the slab;
$A$=the area of the slab;
$T_2$=high temperature;
$T_1$=low temperature;
$L$=the thickness of the slab.

As shown in FIGURE 2, the high temperature $T_2$ is the temperature which is closest to the collector junction and $T_1$ is the temperature at the interface between the contact and the mounting surface. Now 1 watt=1/4.18 calorie/sec. For 25 watts dissipation and K for indium =0.057

$$\frac{25}{4.18}=\frac{0.057\times 0.300}{0.08}(T_2-25^\circ\text{ C.})$$

$$T_2\approx 28^\circ\text{ C.}+25=53^\circ$$

From this it may be seen that indium is a poor conductor of heat, and because of this the junction temperature rises to 53° C. If this indium layer were reduced to a thickness of about 10 mils or about 0.025 centimeter and the same junction temperautre is allowed, then $$\frac{dQ}{dt}=\frac{0.057\times 0.300\times 4.18}{0.025}(28^\circ\text{ C.})=77\text{ watts}$$

This means that the unit could be operated up to 50–77 watt range. One way of achieving this wattage would be by a slight change in the header design as shown in FIGURE 3.

Figure 3:
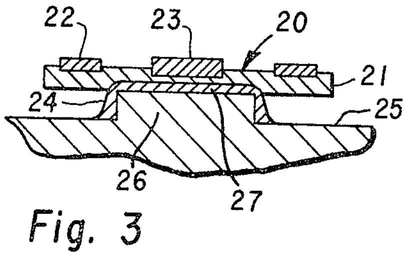
FIGURE 3 is a cross section in elevation showing an improved mounting for an alloy device.

FIGURE 3 shows an alloy transistor device similar to the one shown in FIGURE 1 with the exception that the header mounting surface 25 has a copper stub or protrusion platform 26 thereon which is about 0.300 cm.$^2$ in area. The platform is first wetted with indium so the excess indium will flow down on the stub and will not cover the junction 27. At the time the transistor is mounted on the platform 26 of the header, it is gently lowered until the stub touches the regrowth region of the collector contact. This will allow a thin layer of indium 24 to connect the regrowth region to the platform of the header. In this manner there is only a thin layer of indium whereby the heat may be dissipated almost directly through the platform of the header. If the regrowth or recrystallization region is maintained to about 1–2 mils, then the heat dissipation capabilities of the device will be greatly increased.

Figure 4:
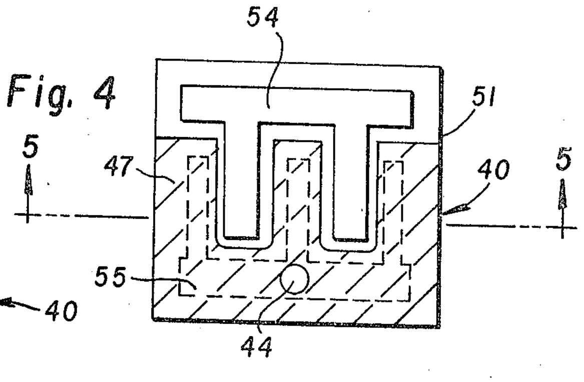
FIGURE 4 is a plan view of the base and emitter contacts for a double-diffused type transistor.
Figure 5:
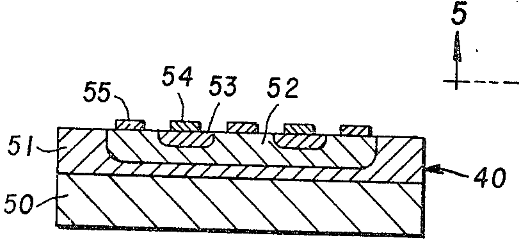
FIGURE 5 is a cross-sectional view of the transistor shown in FIGURE 4 taken along the section line 5—5.

Referring now to FIGURES 4 and 5, there is shown a transistor made by the diffusion process. The device shown is what is known as a planar epitaxial transistor. The entire active portion of the device is made into an epitaxial layer 51 which has been grown onto a substrate 50, a base region 52 is diffused into the collector region 51, and the emitter region 53 is diffused into the base region 52. Contacts are made to the base and emitter regions by the way of contacts 55 and 54; contact 54 contacting the emitter region 53 and contact 55 contacting the base region 52.

A typical device of this design has a reduced collector resistance since the collector is thinner, being a portion of an epitaxial layer upon a low resistance substrate. This, however, does not aid the heat transfer problem. In a typical unit, a good heat sink can dissipate about 40 watts. Using $k$ for silicon to be equal to 1.8, and substituting into Equation 1, $T_2$ comes to about 225° C. This is near the limit of operation for silicon. To improve the operating characteristics of this device, the emitter may be connected to the heat sink since by virtue of this connection the temperature of the device is lowered. This would means a slab of silicon between the junction and the heat sink of about .1 mil or $2.5\times 10^{-4}$ centimeter. The emitter contact is not as large as the collector contact, therefore the effective heat transmitting area of the slab is about .001 cm.$^2$. Substituting the above parameters into Equation 1 and using $T_2$ equal to 200° C. we have $$=\frac{dq}{dt}\frac{0.18\times .001\times 175\times 4.18}{0.25\times 10^{-3}\text{ cm.}}=527\text{ watts}$$

Theoretically, if this unit were attached to an infinite heat sink, it could dissipate 527 watts. However, in practice there is no such thing as an infinite heat sink. A more realistic number would be between 75–100 watts for this unit if bonded to a good heat sink.

Figure 6:
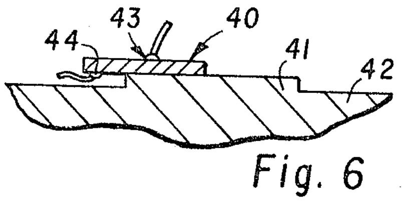
FIGURE 6 shows an arrangement for mounting the double diffused semiconductor device shown in FIGURE 4.

The manner in which the emitter contact may be connected to the heat sink is shown in FIGURE 6 and the connection is attained as follows:

After all the contacts to the respective active areas have been made, a mask is made to cover the surface of the wafer upon which connection to the base contact is made. This area is represented by the shaded portion 47 in FIGURE 4. This shaded portion is covered by some type of insulating material. For example, a layer of silicon oxide may be evaporated onto this region. A small area 44 is masked to prevent a formation of silicon oxide thereon in order to allow contact to be made to the base region. After the layer of silicon oxide is placed upon the wafer so as to cover the base contact area and leave exposed the emitter contacts, the wafer is bonded to the platform 41 on header 42 as shown in FIGURE 6. The purpose of the silicon oxide is to prevent shorting the base contact to the header since the wafer is mounted with the contact area down upon the header. The contact is made at 44 to the base and a contact 43 is made on the upper surface of the wafer constituting the collector contact. The emitter contact, being in direct electrical contact with the raised portion 41 of the header, therefore contacts the header. By mounting the wafer in this way, that is, the emitter directly to the header, an improved heat dissipating device is achieved since the emitter region is thinner than the collector region, providing a shorter path for the heat to flow to the heat sink.

While above described devices and methods of mounting have been applied to alloy and epitaxial planar devices, it is apparent that these methods may be applied to other types of semiconductor devices. Many modifications may be made of the above described embodiments without departing from the spirit and scope of the invention which is limited only as defined in the appended claims.

What is claimed is:

1. The method of mounting an epitaxial planar transistor on a preformed heat conductive header electrode to provide an efficient heat sink, comprising the steps of coating the base electrode of said transistor with an insulating material leaving a small area uncoated to which contact is to be made, mounting the emitter contact area of said transistor on a flat surface of said header, and conductively bonding said emitter to said header in such manner as to maintain said base electrode insulatedly spaced from said header by the thickness of said insulating material.

2. An improved method of mounting a planar epitaxial semiconductor device to a preformed heat conductive header electrode comprising the steps of coating all but the emitter portion of one face of the semiconductor device with silicon oxide layer, leaving a small opening in said silicon oxide layer to make contact therethrough to the base electrode area under the coating; mounting the uncoated emitter portion of said one face upon a flat surface portion of said header, and conductively bonding said uncoated emitter portion to said header in such manner as to maintain said base electrode insulatedly spaced from said header by the thickness of said oxide coating.

References Cited by the Examiner

UNITED STATES PATENTS

| | | | |
|---|---|---|---|
| 2,981,877 | 4/1961 | Noyce. | |
| 2,987,597 | 6/1961 | McCotter. | |
| 3,082,522 | 3/1963 | Doelp | 29—502 X |

JOHN F. CAMPBELL, *Primary Examiner.*

WILLIAM I. BROOKS, *Examiner.*